(12) United States Patent
Yang et al.

(10) Patent No.: US 11,855,017 B2
(45) Date of Patent: Dec. 26, 2023

(54) SEMICONDUCTOR DEVICE AND METHOD

(71) Applicant: Taiwan Semiconductor Manufacturing Co., Ltd., Hsinchu (TW)

(72) Inventors: Ting-Li Yang, Tainan (TW); Po-Hao Tsai, Zhongli (TW); Ming-Da Cheng, Taoyuan (TW); Yung-Han Chuang, Tainan (TW); Hsueh-Sheng Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 101 days.

(21) Appl. No.: 17/342,869

(22) Filed: Jun. 9, 2021

(65) Prior Publication Data
US 2022/0223548 A1 Jul. 14, 2022

Related U.S. Application Data

(60) Provisional application No. 63/137,362, filed on Jan. 14, 2021.

(51) Int. Cl.
*H01L 23/00* (2006.01)

(52) U.S. Cl.
CPC .............. *H01L 24/03* (2013.01); *H01L 24/05* (2013.01); *H01L 24/11* (2013.01); *H01L 24/14* (2013.01);
(Continued)

(58) Field of Classification Search
CPC ......... H01L 24/03; H01L 24/05; H01L 24/11; H01L 24/14; H01L 2224/0231; H01L 2224/02331; H01L 2224/03462; H01L 2224/03914; H01L 2224/0401; H01L 2224/05017; H01L 2224/0603; H01L 2224/06051; H01L 2224/11849;
(Continued)

(56) References Cited

U.S. PATENT DOCUMENTS

| 6,586,844 B1 * | 7/2003 | Chang ..................... H01L 24/14 |
| | | 257/E23.021 |
| 11,083,086 B2 * | 8/2021 | Wu ......................... H01L 24/13 |

(Continued)

FOREIGN PATENT DOCUMENTS

JP 2019009409 A 1/2019

*Primary Examiner* — Douglas W Owens
(74) *Attorney, Agent, or Firm* — Slater Matsil, LLP

(57) ABSTRACT

Methods for forming under-bump metallurgy (UBM) structures having different surface profiles and semiconductor devices formed by the same are disclosed. In an embodiment, a semiconductor device includes a first redistribution line and a second redistribution line over a semiconductor substrate; a first passivation layer over the first redistribution line and the second redistribution line; a first under-bump metallurgy (UBM) structure over and electrically coupled to the first redistribution line, the first UBM structure extending through the first passivation layer, a top surface of the first UBM structure being concave; and a second UBM structure over and electrically coupled to the second redistribution line, the second UBM structure extending through the first passivation layer, a top surface of the second UBM structure being flat or convex.

20 Claims, 16 Drawing Sheets

(52) U.S. Cl.
CPC .............. *H01L 2224/0231* (2013.01); *H01L 2224/02331* (2013.01); *H01L 2224/03462* (2013.01); *H01L 2224/03914* (2013.01); *H01L 2224/0401* (2013.01); *H01L 2224/05017* (2013.01); *H01L 2224/0603* (2013.01); *H01L 2224/06051* (2013.01); *H01L 2224/11849* (2013.01); *H01L 2224/1403* (2013.01); *H01L 2224/14051* (2013.01); *H01L 2924/3841* (2013.01)

(58) Field of Classification Search
CPC ... H01L 2224/1403; H01L 2224/14051; H01L 2924/3841; H01L 2224/13082; H01L 24/12; H01L 23/5226; H01L 23/528; H01L 2224/11; H01L 2224/1405; H01L 24/02; H01L 24/10; H01L 2224/13015; H01L 2224/13019; H01L 2224/13022
See application file for complete search history.

(56) References Cited

U.S. PATENT DOCUMENTS

| | | |
|---|---|---|
| 2007/0205520 A1 | 9/2007 | Chou et al. |
| 2015/0228587 A1* | 8/2015 | Cheng .................... H01L 21/78 257/777 |
| 2016/0111293 A1* | 4/2016 | Hsieh ..................... H01L 24/05 438/460 |
| 2016/0343677 A1* | 11/2016 | Meyer ................ H01L 23/5389 |
| 2017/0236796 A1* | 8/2017 | Obu ........................ H03F 3/213 438/614 |
| 2019/0006306 A1* | 1/2019 | Shibata ................... H01L 24/14 |
| 2019/0246496 A1 | 8/2019 | Wu |
| 2019/0304942 A1* | 10/2019 | Takeuchi ............ H01L 21/4853 |
| 2020/0006141 A1 | 1/2020 | Wang et al. |
| 2020/0118959 A1 | 4/2020 | Kim et al. |
| 2020/0357769 A1 | 11/2020 | Chen et al. |

* cited by examiner

SEMICONDUCTOR DEVICE AND METHOD

PRIORITY CLAIM AND CROSS-REFERENCE

This application claims the benefit of U.S. Provisional Application No. 63/137,362, filed on Jan. 14, 2021, entitled "An Asymmetric Cu Structure to Enable Better Coplanarity for Hybrid Bonding Process Applications," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
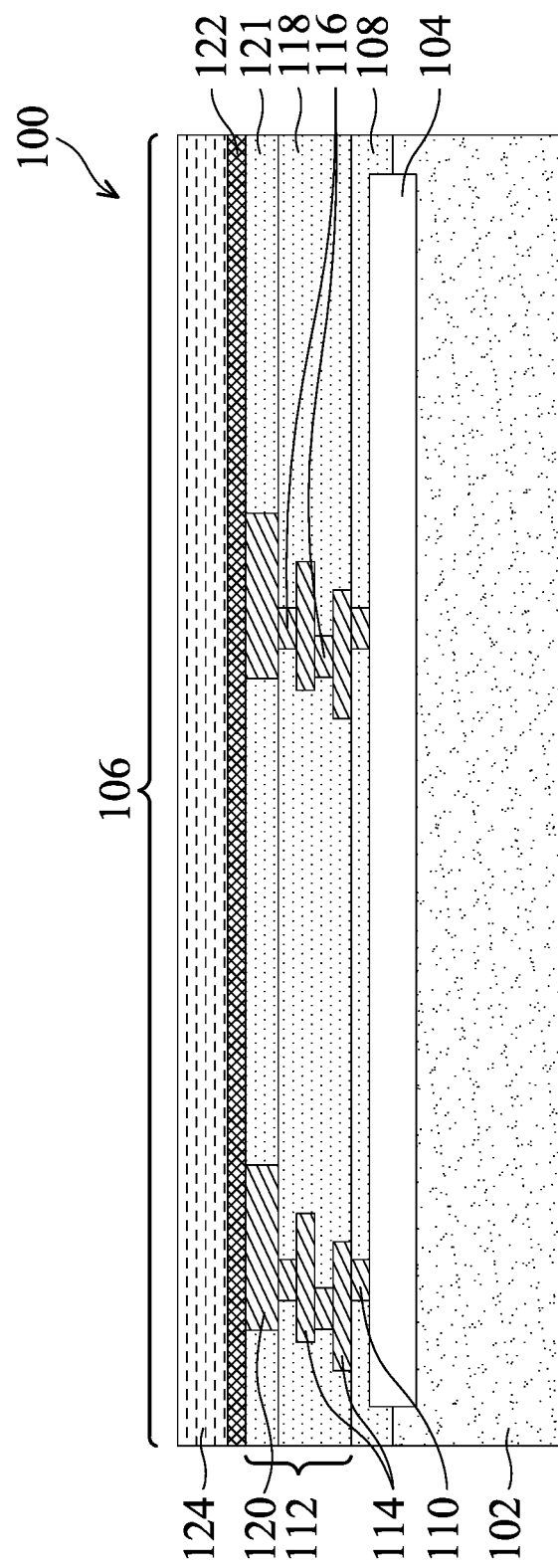
FIGS. 1 through 15 are cross-sectional views of intermediate stages in the manufacturing of semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming different sized under-bump metallizations (UBMs) and conductive bumps, which have improved coplanarity, and semiconductor devices formed by the same. UBMs and conductive bumps having different widths may be used to provide different types of connections between semiconductor devices. However, forming UBMs and conductive bumps with different widths may result in upper extents of top surfaces of the conductive bumps being disposed at different levels. For example, if a conductive material for forming conductive bumps having a same thickness is deposited over two UBMs having the same height and different widths, a top surface of the conductive bump formed over the wider UBM may be disposed above a top surface of the conductive bump formed over the narrower UBM after the conductive material is reflowed.

In order to improve a coplanarity of top surfaces of the conductive bumps, first UBMs having relatively greater widths may be formed with concave upper surfaces, while second UBMs having relatively smaller widths may be formed with flat surfaces or convex upper surfaces. The conductive connectors formed over the first UBMs have a greater volume to fill relative to the conductive connectors formed over the second UBMs, thus the level of upper extents of top surfaces of the conductive connectors formed over the first UBMs is lowered with respect to the conductive connectors formed over the second UBMs. The first UBMs and the second UBMs may be formed using a plating process and the shapes of the top surfaces of the first UBMs and the second UBMs may be controlled based on a concentration of a leveling agent used in a plating solution and a current density applied during the plating process. The method for improving the coplanarity of the conductive bumps reduces yield loss caused by cold joints, solder bridges, and the like. This reduces device defects and increases throughput. Moreover, the first UBMs and the second UBMs may be formed simultaneously and the conductive connectors formed thereover are formed simultaneously, which reduces production time and costs.

FIGS. 1 through 15 illustrate cross-sectional views of intermediate stages in the formation of a device in accordance with some embodiments of the present disclosure. It is appreciated that although a device wafer and a device die are used as examples, the embodiments of the present disclosure may also be applied to form conductive features in other devices (e.g., package components) including, and not limited to, package substrates, interposers, packages, and the like.

FIG. 1 illustrates a cross-sectional view of a semiconductor device 100. In some embodiments, the semiconductor device 100 is a device wafer including active devices and/or passive devices, which are represented as integrated circuit devices 104. The semiconductor device 100 may be singulated to form a plurality of chips/dies 106 therefrom. In FIG. 1, a single die 106 is illustrated. In some embodiments, the semiconductor device 100 is an interposer wafer, which is free from active devices and may include passive devices. In some embodiments, the semiconductor device 100 is a package substrate strip, which includes a core-less package substrate or a cored package substrate with a core therein. In subsequent discussion, a device wafer is used as an example of the semiconductor device 100, and the semiconductor device 100 may be referred to as a wafer. The embodiments of the present disclosure may also be applied to interposer wafers, package substrates, packages, or the like.

In some embodiments, the dies 106 are logic dies (e.g., central processing units (CPUs), graphics processing units (GPUs), system-on-chips (SoCs), application processors (APs), microcontrollers, application-specific integrated circuit (ASIC) dies, or the like), memory dies (e.g., dynamic random access memory (DRAM) dies, static random access memory (SRAM) dies, high bandwidth memory (HBM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies or the like), front-end dies (e.g., analog front-end (AFE) dies), the like, or a combination thereof.

In some embodiments, the semiconductor device 100 includes a semiconductor substrate 102 and features formed at a top surface of the semiconductor substrate 102. The semiconductor substrate 102 may be a bulk semiconductor, a semiconductor-on-insulator (SOI) substrate, or the like, which may be doped (e.g., with a p-type or an n-type dopant) or undoped. The semiconductor substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as a multi-layered or gradient substrate may also be used. In some embodiments, the semiconductor material of the semiconductor substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Shallow trench isolation (STI) regions (not separately illustrated) may be formed in the semiconductor substrate 102 to isolate active regions in the semiconductor substrate 102. Vias (not separately illustrated) may be formed extending into the semiconductor substrate 102 or through the semiconductor substrate 102 (e.g., through-vias) and may be used to electrically inter-couple features on opposite sides of the semiconductor device 100.

In some embodiments, the semiconductor device 100 includes integrated circuit devices 104, which are formed on the top surface of semiconductor substrate 102. The integrated circuit devices 104 may include complementary metal-oxide semiconductor (CMOS) transistors, resistors, capacitors, diodes, and the like. The details of the integrated circuit devices 104 are not illustrated herein. In some embodiments, the semiconductor device 100 is used for forming interposers (which are free from active devices), and the semiconductor substrate 102 may be a semiconductor substrate or a dielectric substrate.

An inter-layer dielectric (ILD) 108 is formed over the semiconductor substrate 102 and fills spaces between gate stacks of transistors (not separately illustrated) in the integrated circuit devices 104. In some embodiments, the ILD 108 is formed of phosphosilicate glass (PSG), borosilicate glass (BSG), boron-doped phosphosilicate glass (BPSG), fluorine-doped silicate glass (FSG), silicon oxide, combinations or multiple layers thereof, or the like. The ILD 108 may be formed using spin coating, flowable chemical vapor deposition (FCVD), or the like. In some embodiments, the ILD 108 is formed using a deposition method such as plasma-enhanced chemical vapor deposition (PECVD), low-pressure chemical vapor deposition (LPCVD), or the like.

Contact plugs 110 are formed in the ILD 108 and electrically couple the integrated circuit devices 104 to overlying metal lines and/or vias. In some embodiments, the contact plugs 110 are formed of conductive materials, such as tungsten (W), aluminum (Al), copper (Cu), titanium (Ti), tantalum (Ta), titanium nitride (TiN), tantalum nitride (TaN), alloys or multiple layers thereof, or the like. The formation of the contact plugs 110 may include forming contact openings in the ILD 108, filling the conductive materials into the contact openings, and performing a planarization process (such as a chemical mechanical polish (CMP) process, a mechanical grinding process, an etch-back process, or the like) to level top surfaces of the contact plugs 110 with top surfaces of the ILD 108.

An interconnect structure 112 is formed over the ILD 108 and the contact plugs 110. The interconnect structure 112 includes metal lines 114 and metal vias 116, which are formed in dielectric layers 118 (also referred to as inter-metal dielectrics (IMDs)). The metal lines 114 that are formed at a same level are collectively referred to as a metal layer. In some embodiments, the interconnect structure 112 includes a plurality of metal layers including the metal lines 114 that are interconnected through the metal vias 116. The metal lines 114 and the metal vias 116 may be formed of copper, copper alloys, other metals, or the like.

In some embodiments, the dielectric layers 118 are formed of low-k dielectric materials. The dielectric constants (k-values) of the low-k dielectric materials may be lower than about 3.0. The dielectric layers 118 may comprise carbon-containing low-k dielectric materials, hydrogen silsesquioxane (HSQ), methylsilsesquioxane (MSQ), combinations or multiple layers thereof, or the like. In some embodiments, the dielectric layers 118 may include phosphosilicate glass (PSG), boro-silicate glass (BSG), boron-doped phospho-silicate glass (BPSG), undoped silicate glass (USG), or the like. In some embodiments, the dielectric layers 118 may comprise oxides (e.g., silicon oxide or the like), nitrides (e.g., silicon nitride or the like), combinations thereof, or the like. The dielectric layers 118 may be formed by FCVD, PECVD, LPCVD, or the like. In some embodiments, the formation of the dielectric layers 118 includes depositing a porogen-containing dielectric material in the dielectric layers 118 and then performing a curing process to drive out the porogen. As such, the dielectric layers 118 may be porous.

The formation of the metal lines 114 and the metal vias 116 in the dielectric layers 118 may include single damascene processes and/or dual damascene processes. In a single damascene process, a trench or a via opening is formed in one of the dielectric layers 118 and the trench or the via opening is filled with a conductive material. A planarization process, such as a CMP process, is then performed to remove excess portions of the conductive material, which may be higher than top surfaces of the dielectric layer 118, leaving a metal line 114 or a metal via 116 in the corresponding trench or via opening. In a dual damascene process, a trench and a via opening are both formed in a dielectric layer 118, with the via opening underlying and being connected to the trench. Conductive materials are filled into the trench and the via opening to form a metal line 114 and a metal via 116, respectively. The conductive materials may include a diffusion barrier layer and a copper-containing metallic material over the diffusion barrier layer. The diffusion barrier layer may include titanium, titanium nitride, tantalum, tantalum nitride, or the like.

Top metal features 120 may be formed in a top dielectric layer 121. The top metal features 120 may be formed of the same or similar materials and by the same or similar processes to the metal lines 114 and the metal vias 116 and the top dielectric layer 121 may be formed of the same or similar materials and by the same or similar processes to the dielectric layers 118. The top metal features 120 may refer to a topmost layer of metallization in the interconnect structure 112. Although FIG. 1 illustrates the interconnect structure 112 as having a particular number of metallization layers, any number of metal layers may be included in other embodiments. The top dielectric layer 121 and the underlying dielectric layer 118 that is immediately underlying the top dielectric layer 121 may be formed as a single continuous dielectric layer, or may be formed as different dielectric layers using different processes, and/or formed of materials different from each other.

A first passivation layer 122 and a second passivation layer 124 may be formed over the interconnect structure 112. The first passivation layer 122 and the second passivation layer 124 may be collectively referred to as the first passivation structure. In some embodiments, the first passivation layer 122 and the second passivation layer 124 may include phospho-silicate glass (PSG), boro-silicate glass (BSG), boron-doped phospho-silicate glass (BPSG), undoped silicate glass (USG), or the like. In some embodiments, the first passivation layer 122 and the second passivation layer 124 may include an inorganic dielectric material, which may include a material selected from silicon nitride ($SiN_x$), silicon oxide ($SiO_2$), silicon oxy-nitride ($SiON_x$), silicon oxy-carbide ($SiOC_x$), silicon carbide (SiC), combinations or multiple layers thereof, or the like. The first passivation layer 122 and the second passivation layer 124 may be formed of different materials. For example, the first passivation layer 122 may comprise silicon nitride (SiN) and the second passivation layer 124 may comprise undoped silicate glass (USG). In some embodiments, the first passivation layer 122 may comprise a single layer and the second passivation layer 124 may be omitted. In some embodiments, top surfaces of the top dielectric layer 121 and the top metal features 120 are coplanar (e.g., level with one another). Accordingly, the first passivation layer 122 and the second passivation layer 124 may be planar layers. In some embodiments, the top metal features 120 protrude higher than top surfaces of the top dielectric layer 121, and the first passivation layer 122 and the second passivation layer 124 are non-planar. The first passivation layer 122 and the second passivation layer 124 may be deposited by chemical vapor deposition (CVD), physical vapor deposition (PVD), atomic layer deposition (ALD), or the like.

Figure 2:
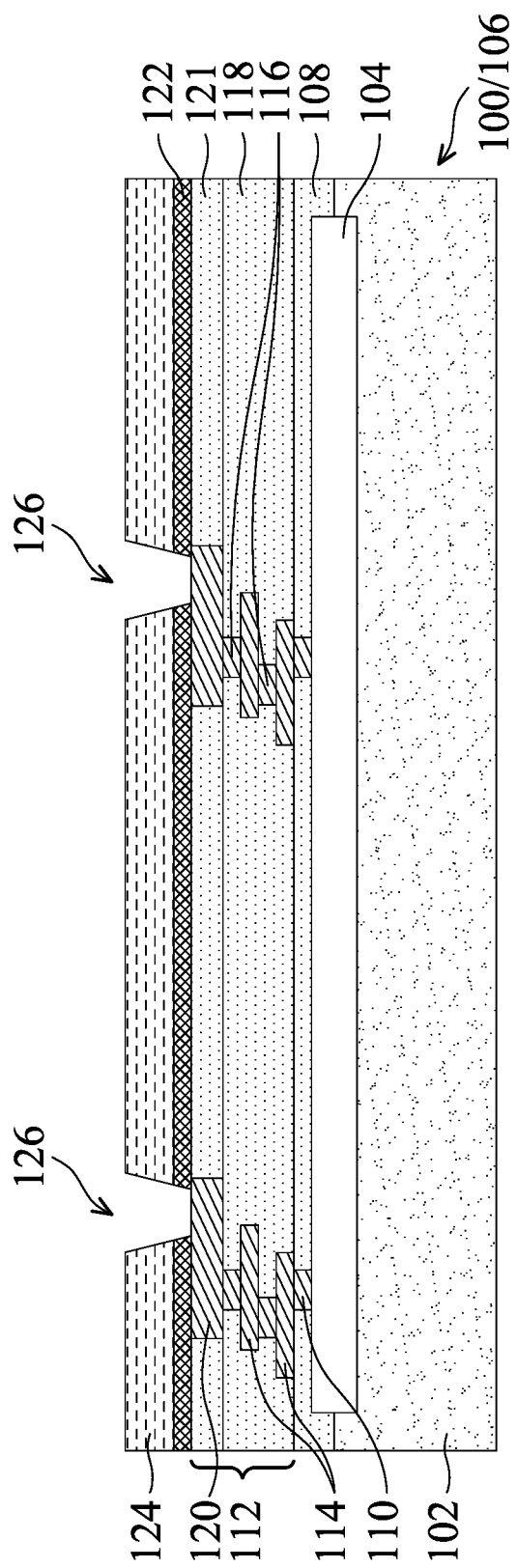

In FIG. 2, openings 126 are formed in the first passivation layer 122 and the second passivation layer 124. The openings 126 may be formed using an etching process, which may include a dry etching process. The etching process may include forming a patterned etching mask (not separately illustrated), such as a patterned photoresist, and then etching the first passivation layer 122 and the second passivation layer 124 using the patterned photoresist as a mask. The patterned etching mask is then removed. The openings 126 may be patterned through the first passivation layer 122 and the second passivation layer 124 and may expose the top metal features 120.

Figure 3:
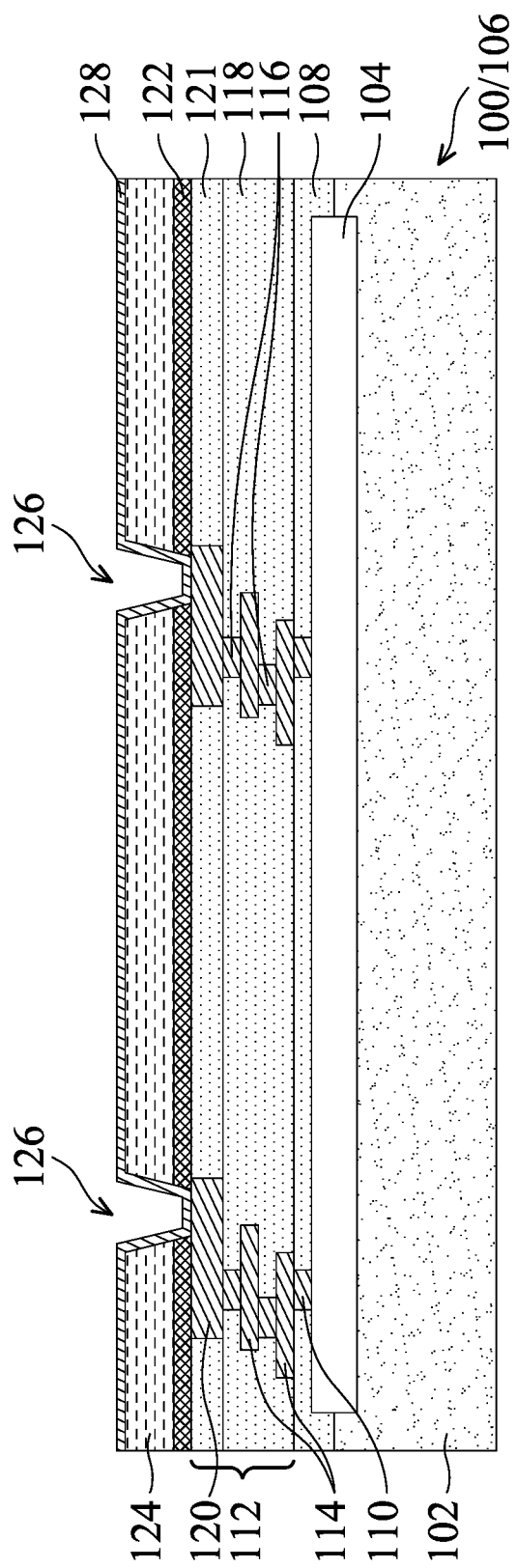

In FIG. 3, a seed layer 128 is formed over the second passivation layer 124, the first passivation layer 122, and the top metal features 120 and in the openings 126. The seed layer 128 may comprise a titanium layer and a copper layer over the titanium layer. In some embodiments, the seed layer 128 comprises a copper layer in contact with the second passivation layer 124, the first passivation layer 122, and the top metal features 120. The seed layer 128 may be formed by a deposition process such as PVD, or the like.

Figure 4:
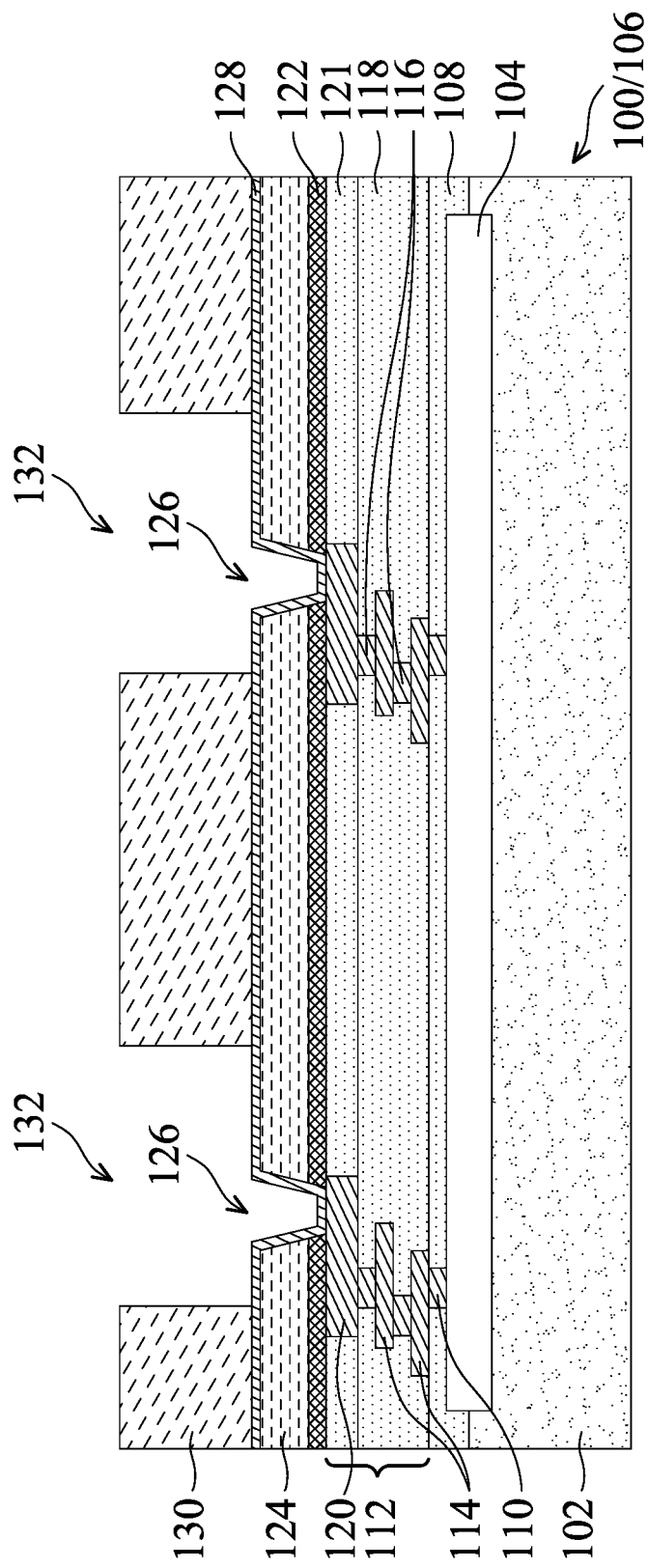

In FIG. 4, a patterned photoresist 130 is formed over the seed layer 128. The patterned photoresist 130 may be formed by depositing a photosensitive layer over the seed layer 128 using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned photoresist 130. Openings 132, which expose the seed layer 128, are formed extending through the patterned photoresist 130. The pattern of the patterned photoresist 130 corresponds to redistribution layers (RDLs) to be formed in the patterned photoresist 130, as will be discussed below with respect to FIG. 5.

Figure 5:
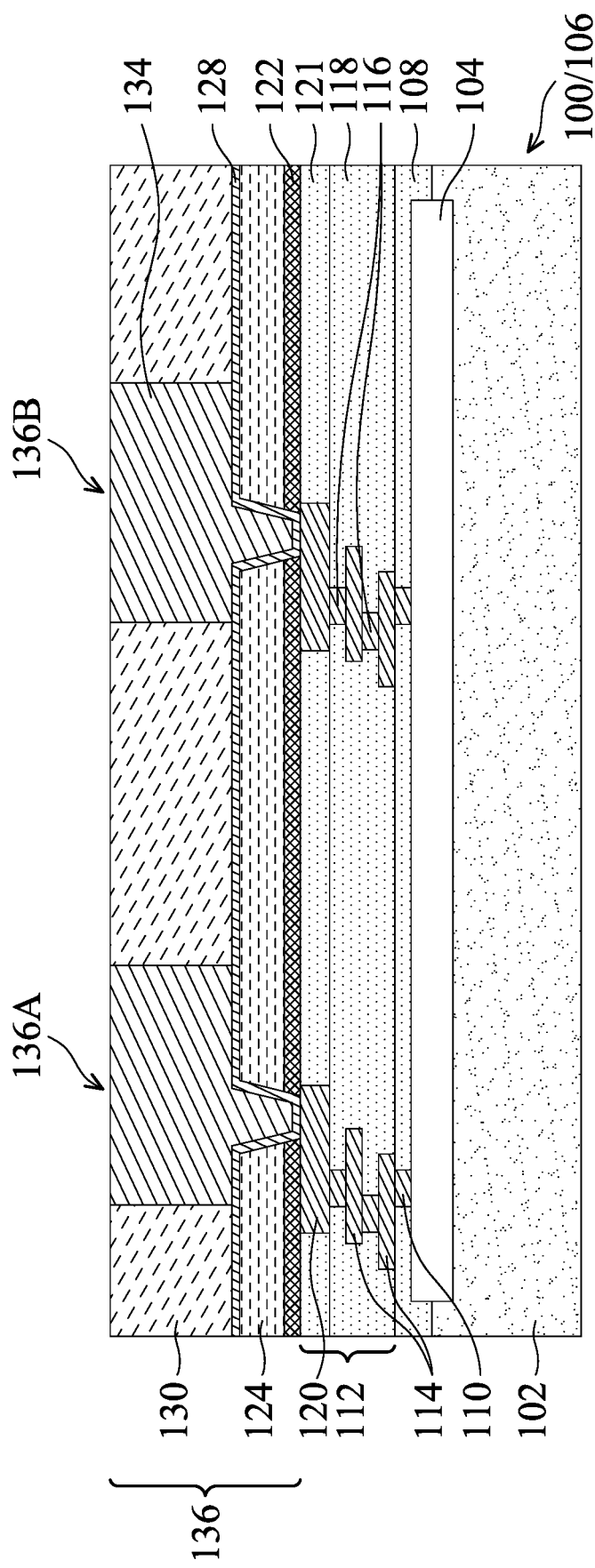

In FIG. 5, a conductive material 134 is formed over exposed portions of the seed layer 128 and filling the openings 126 and the openings 132. The conductive material 134 may be formed by plating, such as electroplating or electroless plating, or the like. The conductive material 134 may comprise a metal, such as copper, titanium, tungsten, aluminum, a combination or alloy thereof, or the like. The combination of the conductive material 134 and underlying portions of the seed layer 128 form an RDL 136A and an RDL 136B (collectively referred to as RDLs 136). Each of the RDLs 136 may include a via portion extending through the second passivation layer 124 and the first passivation layer 122 and a trace/line portion over the second passivation layer 124. Although only two of the RDLs 136 are illustrated in FIG. 5, any number of the RDLs 136 may be formed over each of the dies 106.

Figure 6:
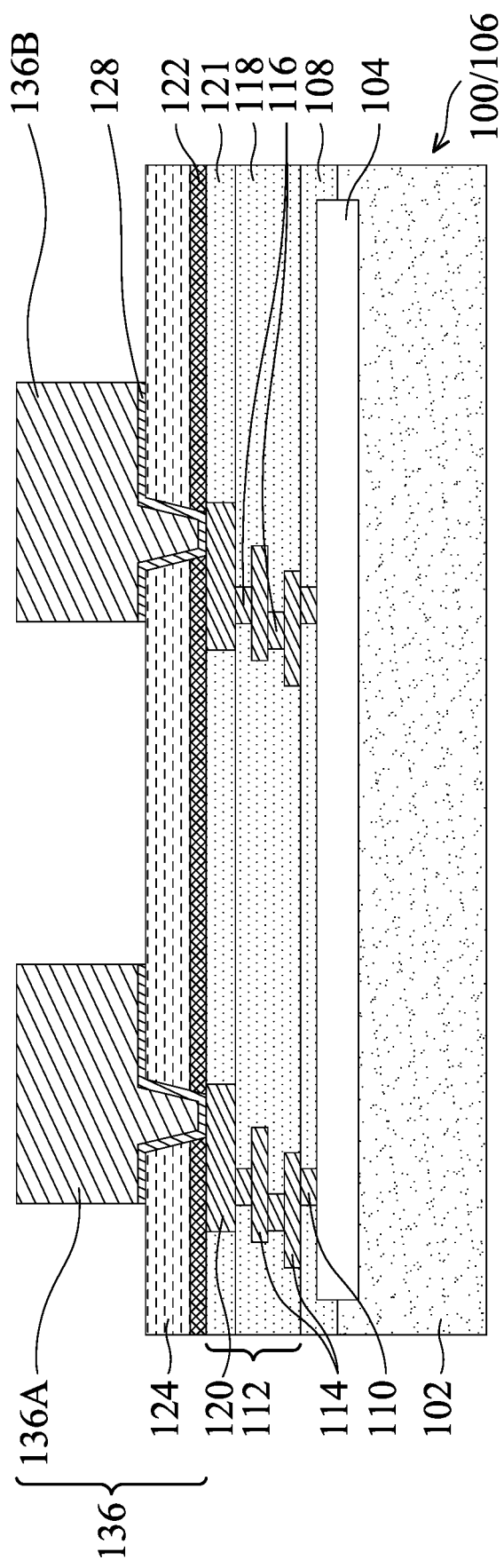

In FIG. 6, the patterned photoresist 130 and portions of the seed layer 128 on which the conductive material 134 is not formed are removed. The patterned photoresist 130 may be removed by an acceptable ashing or stripping process, such as using an oxygen plasma or the like. Once the patterned photoresist 130 is removed, exposed portions of the seed layer 128 are removed using an acceptable etching process, such as wet or dry etching. One or more optional cleaning processes may also be performed.

Figure 7:
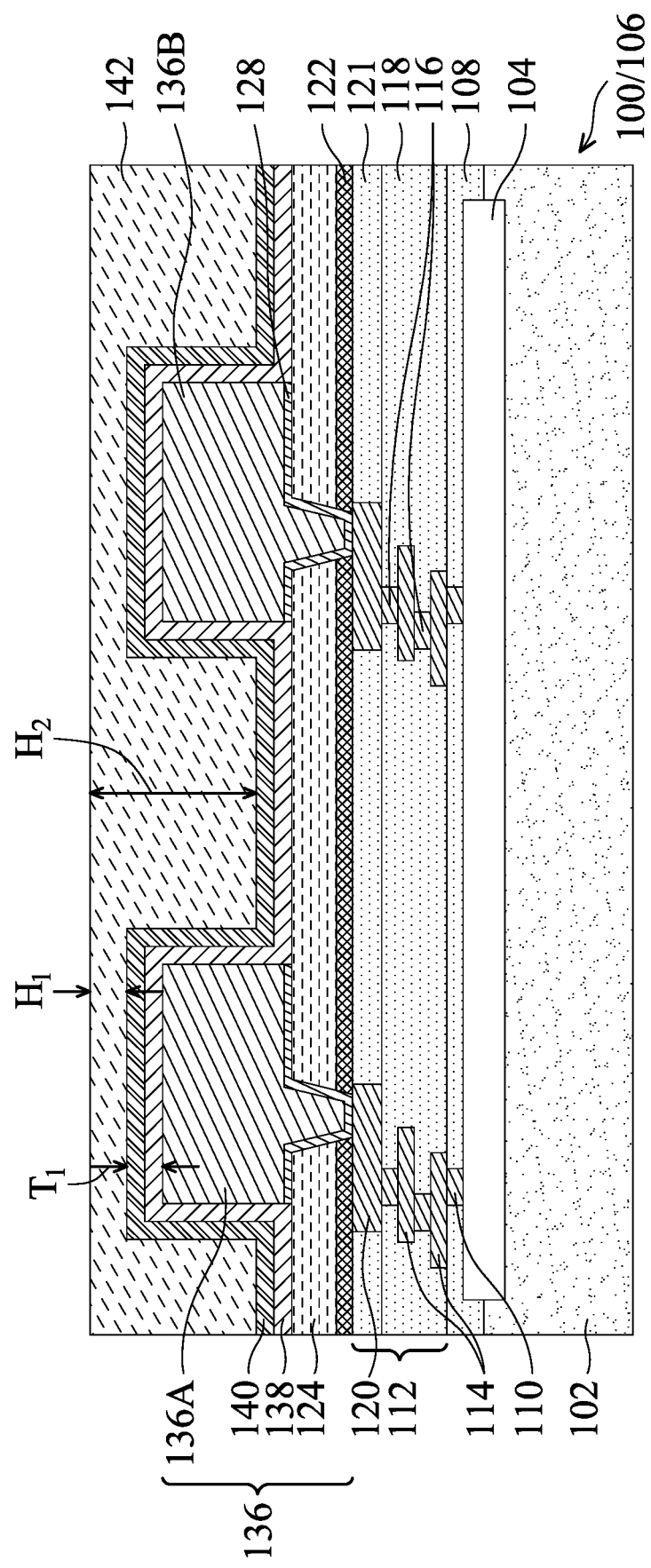

In FIG. 7, a third passivation layer 138, a fourth passivation layer 140, and a protection layer 142 are formed over the second passivation layer 124 and over and along sidewalls and top surfaces of the RDLs 136. The third passivation layer 138 and the fourth passivation layer 140 may be collectively referred to as the second passivation structure. The third passivation layer 138 and the fourth passivation layer 140 may be formed of materials the same as or different from the materials of the first passivation layer 122 and the second passivation layer 124. In some embodiments, the third passivation layer 138 and the fourth passivation layer 140 may be formed of inorganic dielectric materials, such as silicon nitride, silicon oxide, silicon oxynitride, silicon oxycarbide, silicon carbide, combinations or multiple layers thereof, or the like. In some embodiments, the third passivation layer 138 may comprise silicon oxide and the fourth passivation layer 140 may comprise silicon nitride. The third passivation layer 138 may be made of materials that have a high etching selectivity from the material of the fourth passivation layer 140, such that the third passivation layer 138 may act as an etch stop layer for a process used to etch the fourth passivation layer 140. In some embodiments, the third passivation layer 138 may be a single layer, and the fourth passivation layer 140 may be omitted. The third passivation layer 138 and the fourth passivation layer 140 may be deposited by CVD, ALD, or the like. The third passivation layer 138 and the fourth passivation layer 140 may have a combined thickness $T_1$ ranging from about 0.5 µm to about 5.0 µm or from about 1.0 µm to about 2.5 µm.

The protection layer 142 is then formed over the fourth passivation layer 140. In some embodiments, the protection layer 142 is formed of a polymer material (which may be photosensitive) such as polyimide, polybenzoxazole (PBO), benzocyclobutene (BCB), an epoxy, or the like. The protection layer 142 may be formed by CVD, PECVD, a spin-coating process, or the like. In some embodiments, the formation of the protection layer 142 includes coating the protection layer 142 in a flowable form, and then baking to harden the protection layer 142. A planarization process, such as a CMP or a mechanical grinding process may be performed to level the top surface of the protection layer 142. The protection layer 142 may have a height $H_1$ over the RDLs 136 ranging from about 1.0 µm to about 10 µm. The protection layer 142 may further have a height $H_2$ over the second passivation layer 124 between the RDLs 136 ranging from about 2 µm to about 40 µm or from about 4.5 µm to about 20 µm.

Figure 8:
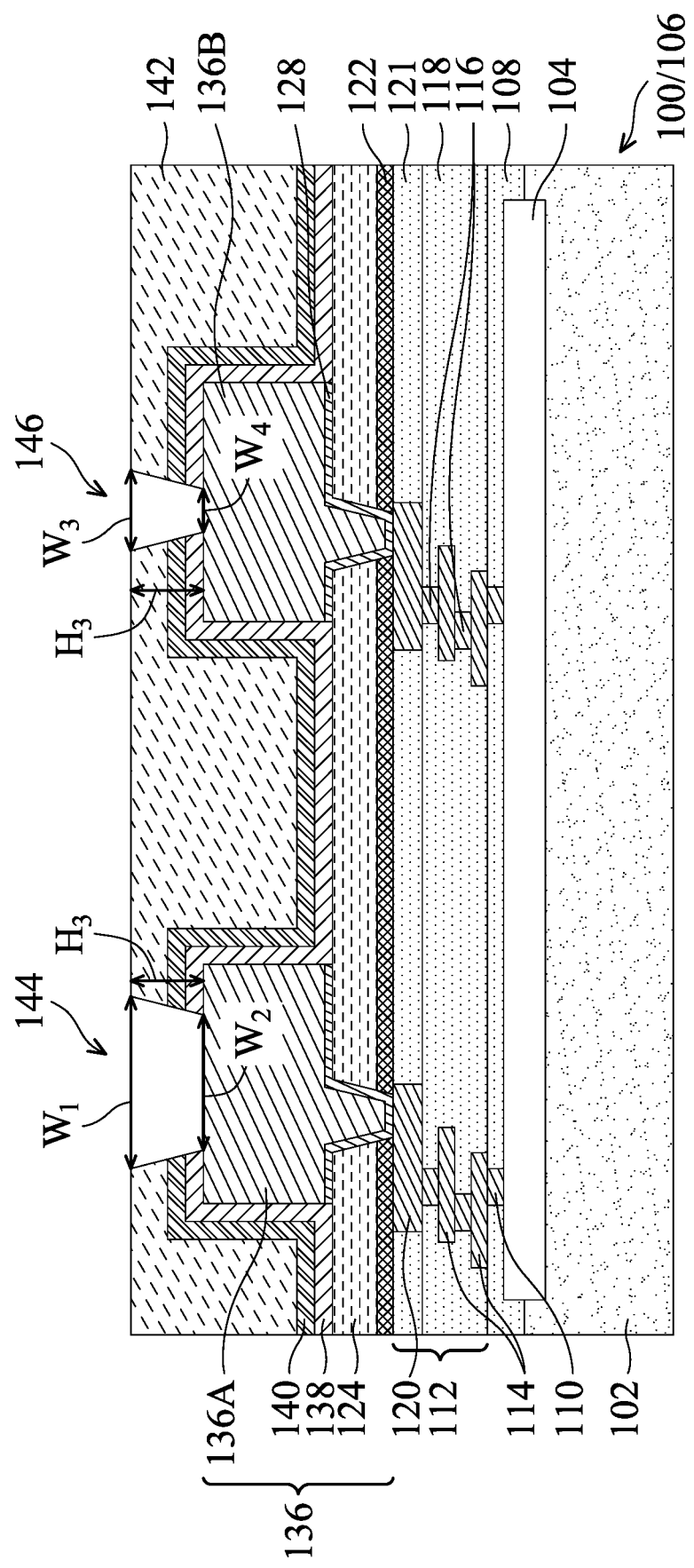

In FIG. 8, a first opening 144 and a second opening 146 are formed through the protection layer 142, the fourth passivation layer 140, and the third passivation layer 138 over the RDL 136A and the RDL 136B, respectively. In embodiments in which the protection layer 142 comprises a photosensitive material, the protection layer 142 may be patterned by exposing the protection layer 142 to a patterned energy source (e.g., a patterned light source) and developing the protection layer 142 to remove an exposed or unexposed portion of the protection layer 142, thereby forming the first opening 144 and the second opening 146. The first opening 144 and the second opening 146 may then be extended through the fourth passivation layer 140 and the third passivation layer 138 to expose the RDL 136A and the RDL 136B, respectively, using the protection layer 142 as a mask. The fourth passivation layer 140 and the third passivation layer 138 may be etched using any acceptable etch process, such as a reactive ion etch (RIE), neutral beam etch (NBE), the like, or a combination thereof. The etch process may be anisotropic.

As illustrated in FIG. 8, the first opening 144 and the second opening 146 may have tapered sidewalls, which narrow in a direction toward the semiconductor substrate 102. In some embodiments, the sidewalls of the first opening 144 and the second opening 146 may be substantially vertical or may be tapered and may widen in a direction toward the semiconductor substrate 102. The first opening 144 may have a width $W_1$ level with a top surface of the protection layer 142 ranging from about 5 µm to about 80 µm or from about 10 µm to about 50 µm and a width $W_2$ level with a bottom surface of the third passivation layer 138 over the RDL 136A ranging from about 5 µm to about 80 µm or from about 10 µm to about 50 µm. The second opening 146 may have a width $W_3$ level with a top surface of the protection layer 142 ranging from about 5 µm to about 80 µm or from about 10 µm to about 50 µm and a width $W_4$ level with a bottom surface of the third passivation layer 138 over the RDL 136B ranging from about 5 µm to about 80 µm or from about 10 µm to about 50 µm. Ratios of the width $W_3$ to the width $W_1$ and the width $W_4$ to the width $W_2$ may range from about 1.0 to about 8.0. The first opening 144 and the second opening 146 may have heights $H_3$ ranging from about 2 µm to about 40 µm or from about 4.5 µm to about 20 µm. In some embodiments, the first opening 144 is larger (e.g., wider) than the second opening 146. For example, the width $W_1$ of the first opening 144 may be greater than the width $W_3$ of the second opening 146, and the width $W_2$ of the first opening 144 may also be greater than the width $W_4$ of the second opening 146.

The protection layer 142 may then be cured using a curing process. The curing process may comprise heating the protection layer 142 to a predetermined temperature for a predetermined period of time using an anneal process or other heating process. The curing process may also comprise an ultra-violet (UV) light exposure process, an infrared (IR) energy exposure process, combinations thereof, or a combination thereof with a heating process. Alternatively, the protection layer 142 may be cured using other methods. In some embodiments, the curing process is not included, or is performed before forming the first opening 144 and the second opening 146.

Figure 9:
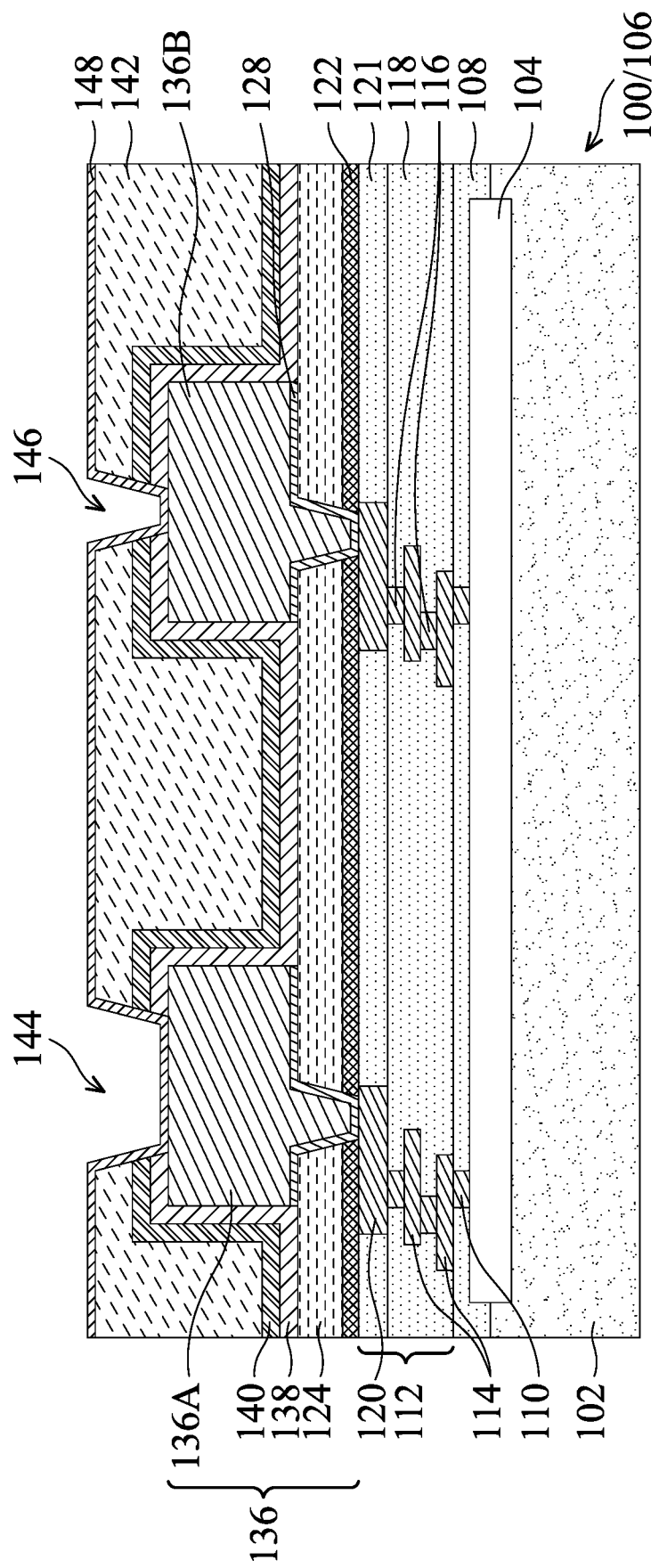

In FIG. 9, a seed layer 148 is formed over the RDLs 136, the third passivation layer 138, the fourth passivation layer 140, and the protection layer 142 and in the first openings 144 and the second openings 146. The seed layer 148 may comprise a titanium layer and a copper layer over the titanium layer. In some embodiments, the seed layer 148 comprises a copper layer in contact with the RDLs 136, the third passivation layer 138, the fourth passivation layer 140, and the protection layer 142. The seed layer 148 may be formed by a deposition process such as PVD, or the like. As illustrated in FIG. 9, a bottom surface of the seed layer 148 in the first opening 144 may be level with a bottom surface of the seed layer 148 in the second opening 146. The seed layer 148 includes horizontal portions extending along a top surface of the protection layer 142, diagonal portions extending along sidewalls of the third passivation layer 138, the fourth passivation layer 140, and the protection layer 142, and horizontal portions extending along top surfaces of the RDLs 136.

Figure 10:
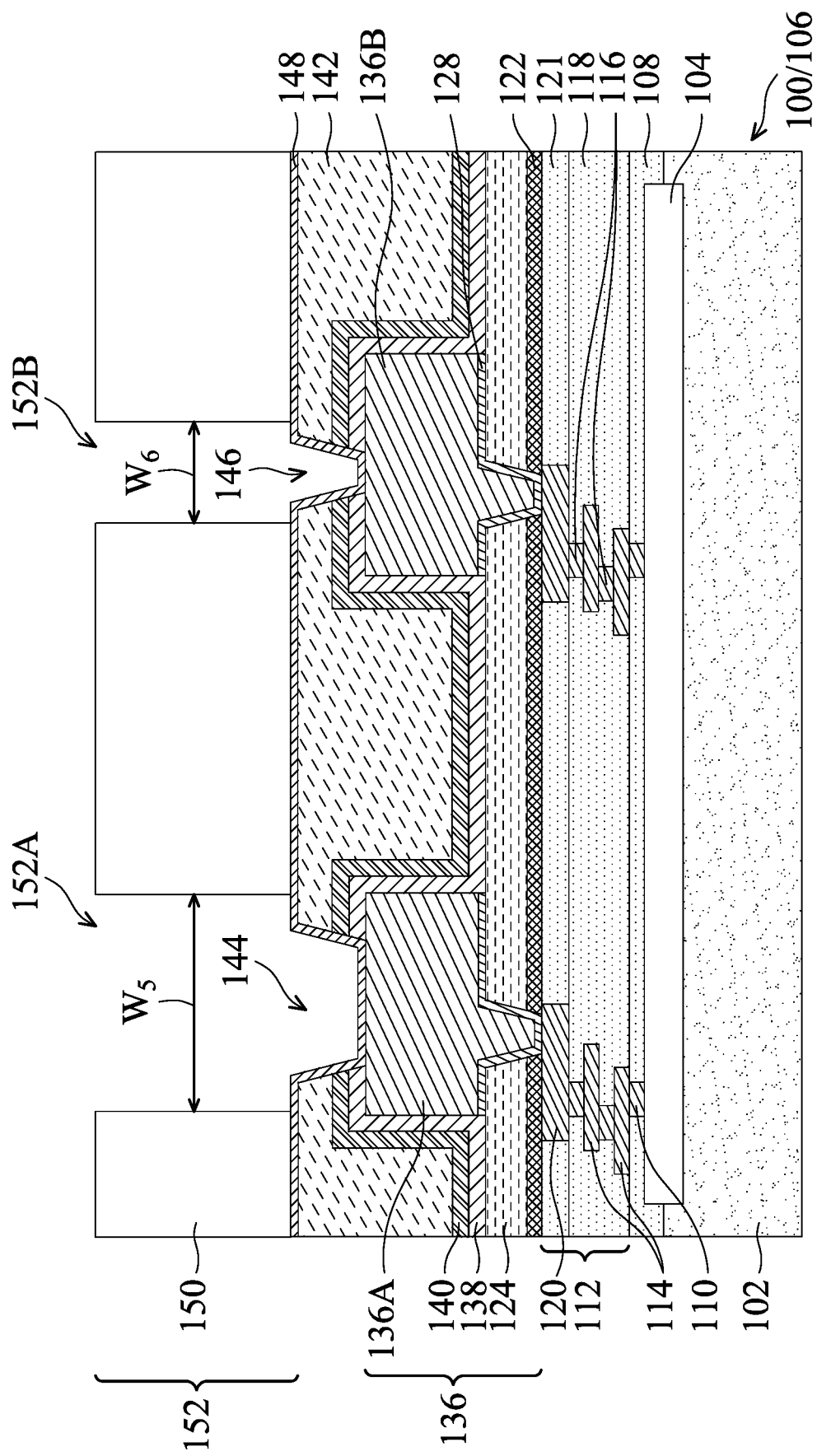

In FIG. 10, a patterned photoresist 150 is formed over the seed layer 148. The patterned photoresist 150 may be formed by depositing a photosensitive layer over the seed layer 148 using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned photoresist 150. A first opening 152A exposing the seed layer 148 over the RDL 136A and a second opening 152B exposing the seed layer 148 over the RDL 136B are formed extending through the patterned photoresist iso. The first opening 152A and the second opening 152B may be collectively referred to as openings 152. The pattern of the patterned photoresist 150 corresponds to under-bump metallizations (UBMs) to be formed in the patterned photoresist 150, as will be discussed below with respect to FIGS. 11A and 11B.

The first opening 152A may have a width $W_5$ ranging from about 10 µm to about 90 µm and the second opening 152B may have a width $W_6$ ranging from about 5 µm to about 80 µm. A ratio of the width $W_5$ of the first opening 152A to the width $W_6$ of the second opening 152B may range from about 1.5 to about 10 or from about 2 to about 5. In some embodiments, the first opening 152A is larger (e.g., wider) than the second opening 152B. For example, the width $W_5$ of the first opening 152A may be greater than the width $W_6$ of the second opening 152B. A ratio of an area of the first opening 152A to an area of the second opening 152B in a top-down view (not separately illustrated) may range from about 2.5 to about 16. Different types of UBMs may be subsequently formed in the first opening 152A and the second opening 152B and the dimensions of the first opening 152A and the second opening 152B may be based on the types of UBMs to be formed therein. In some embodiments, controlled collapse chip connection (C4) bumps may be formed in the first opening 152A and micro bumps (μbumps) may be formed in the second openings 152B. Forming the first opening 152A and the second opening 152B simultaneously, and subsequently forming the UBMs and the conductive contacts simultaneously, reduces the masks required to form the UBMs and the conductive contacts and reduces costs.

Figure 11A:
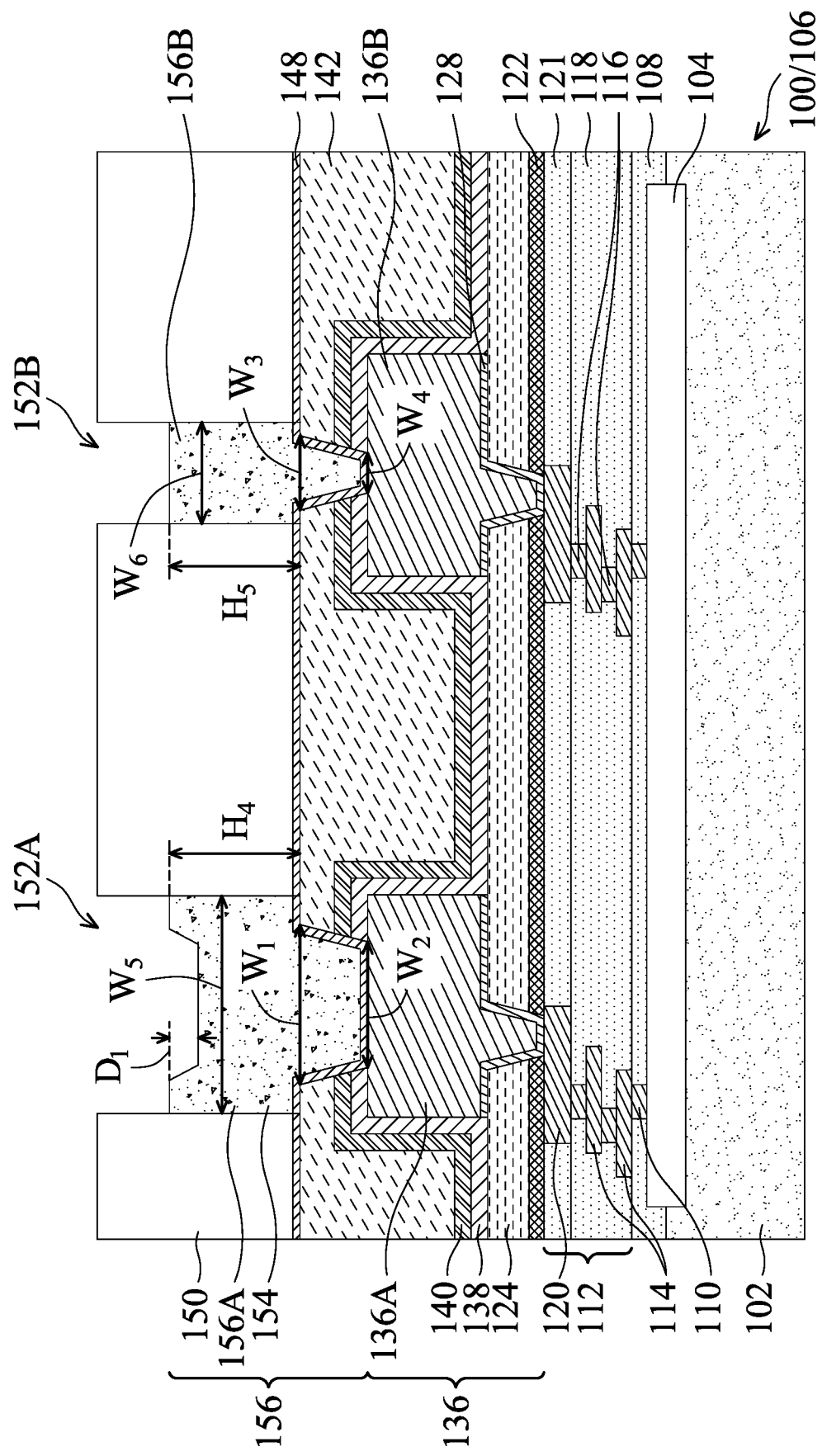
Figure 11B:
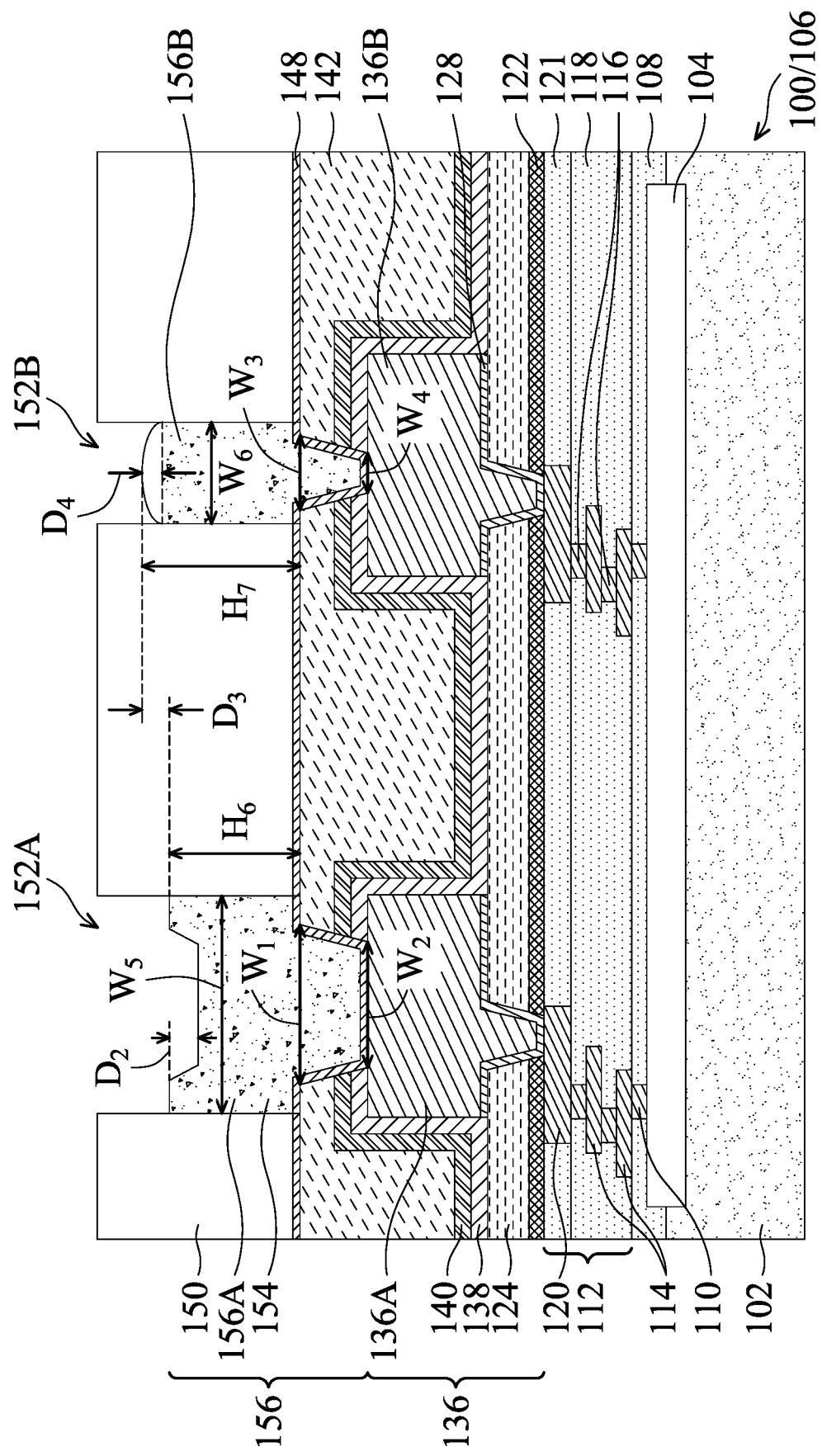

In FIGS. 11A and 11B, a conductive material 154 is deposited in the first opening 152A and the second opening 152B. The conductive material 154 may be deposited by plating, such as electroplating or the like. The conductive material 154 may comprise a metal, such as copper (Cu), nickel (Ni), silver (Ag), combinations thereof, or the like. The combination of the conductive material 154 and underlying portions of the seed layer 148 form a first UBM 156A in the first opening 152A and a second UBM 156B in the second opening 152B (collectively referred to as UBMs 156). Conductive connectors (such as the conductive connectors 160, discussed below with respect to FIG. 13) may be subsequently formed on the UBMs 156 to provide external connection to the semiconductor device 100. The UBMs 156 may include bump portions extending along a top surface of the protection layer 142. The UBMs 156 may also include via portions in the first opening 144 and the second opening 146 (e.g., extending through the protection layer 142, the fourth passivation layer 140, and the third passivation layer 138) that are physically and electrically coupled to the RDLs 136. As a result, the UBMs 156 are electrically coupled to devices (e.g., the integrated circuit devices 104 of the semiconductor substrate 102).

In embodiments in which the conductive material 154 is formed by a plating process, the dies 106 may be submerged in a plating solution. A direct current may be applied to the semiconductor substrate 102. In embodiments in which the conductive material 154 comprises copper, the plating solution may comprise copper sulfate ($CuSO_4$), sulfuric acid ($H_2SO_4$), and hydrochloric acid (HCl). The plating solution may further include additives, such as an accelerator agent, a suppressor agent, a leveling agent, combinations thereof, or the like. In some embodiments, the plating solution may comprise copper sulfate having a concentration ranging from about 20 g/L to about 175 g/L, sulfuric acid having a concentration ranging from about 50 g/L to about 300 g/L, hydrochloric acid having a concentration ranging from about 10 ppm to about 100 ppm, a leveling agent having a concentration ranging from about 5 cc/L to about 30 cc/L, an accelerator agent having a concentration ranging from about 5 cc/L to about 30 cc/L, and a suppressor agent having a concentration ranging from about 5 cc/L to about 30 cc/L.

The leveling agent may be adsorbed on surfaces of the conductive material 154 as the conductive material 154 is deposited. The leveling agent may prevent the conductive material 154 from being deposited with a top surface having a convex profile, with greater concentrations of the leveling agent resulting in the conductive material 154 being deposited with a less convex profile. For example, if the conductive material 154 is deposited with a plating solution that does not include the leveling agent, the conductive material 154 may have a convex top surface. As the concentration of the leveling agent present in the openings 152 increases, the conductive material 154 may be deposited with a less convex top surface such as a flat top surface or a concave top surface.

In some embodiments, the leveling agent may comprise polar molecules. For example, the leveling agent may include one or more halo-groups, such as a chloro-group or the like. Because the leveling agent includes polar molecules, the leveling agent may be attracted to the first opening 152A and the second opening 152B based on an electric field applied through the RDL 136A and the RDL 136B, respectively. The electric field applied through the RDL 136A and the RDL 136B is a result of the direct current being applied to the semiconductor substrate 102 during the electroplating. The magnitude of the electric field applied through the RDL 136A and the RDL 136B depends on the areas of the RDL 136A and the RDL 136B and the applied current density. The first opening 152A has an area larger than the second opening 152B, resulting in the electric field applied in the first opening 152A being greater than the electric field applied in the second opening 152B. This causes a greater concentration of the leveling agent to be present in the first opening 152A than the second opening 152B. As a result, more of the leveling agent is adsorbed on the conductive material 154 in the first opening 152A than the second opening 152B and the first UBM 156A is formed with a less convex surface than the second UBM 156B. This is illustrated by the first UBM 156A being formed with a concave surface in the embodiments illustrated in FIGS. 11A and 11B, and the second UBM 156B being formed with a more convex surface (e.g., a flat surface in the embodiment illustrated in FIG. 11A and a convex surface in the embodiment illustrated in FIG. 11B). The conductive material 154 may be plated using a current density ranging from about 1 amp/dm$^2$ (ASD) to about 15 ASD. The area of the first opening 152A is from about 5 to about 16 times greater than the area of the second opening 152B (e.g., in a top-down view) such that the current applied in the first opening 152A may be from about 5 to about 16 times greater than the current applied in the second opening 152B.

The surface profiles of the UBMs 156 illustrated in FIGS. 11A and 11B may be the result of including different concentrations of the leveling agent in the plating solution, applying different current densities, combinations thereof, or the like. For example, the surface profiles illustrated in FIG. 11A may be achieved by including higher concentrations of the leveling agent and/or using higher current densities with respect to the embodiment illustrated in FIG. 11B. For the embodiment illustrated in FIG. 11A, a concentration of the leveling agent in the plating solution may range from about 5 cc/L to about 30 cc/L and a current density ranging from about 1 ASD to about 15 ASD may be applied to the dies 106. For the embodiment illustrated in FIG. 11B, a concentration of the leveling agent in the plating solution may range from about 5 cc/L to about 30 cc/L and a current density ranging from about 1 ASD to about 15 ASD may be applied to the dies 106. The current density may be adjusted by altering the direct current applied to the semiconductor substrate 102.

In the embodiment illustrated in FIG. 11A, the first UBM 156A has the width $W_5$ over the protection layer 142 ranging from about 10 μm to about 90 μm, the width $W_1$ level with a top surface of the protection layer 142 ranging from about 5 μm to about 80 μm or from about 10 μm to about 50 μm, and a bottom surface of the first UBM 156A has the width $W_2$ ranging from about 5 µm to about 80 µm or from about 10 µm to about 50 µm. The first UBM 156A has a height $H_4$ over the protection layer 142 ranging from about 5 µm to about 18 µm. The top surface of the first UBM 156A is concave such that a distance $D_1$ between an upper extent of the first UBM 156A and a lower extent of the top surface of the first UBM 156A ranges from about 0.1 µm to about 10 µm or from about 0.5 µm to about 6 µm. The second UBM 156B has the width $W_6$ over the protection layer 142 ranging from about 5 µm to about 50 µm, the width $W_3$ level with a top surface of the protection layer 142 ranging from about 5 µm to about 80 µm or from about 10 µm to about 50 µm, and a bottom surface of the second UBM 156B has the width $W_4$ ranging from about 5 µm to about 80 µm or from about 10 µm to about 50 µm. The second UBM 156B has a height $H_5$ over the protection layer 142 ranging from about 5 µm to about 18 µm. The top surface of the second UBM 156B may be substantially planar. In some embodiments, the height $H_5$ of the second UBM 156B may be equal to the height $H_4$ of the first UBM 156A. In some embodiments, the height $H_5$ of the second UBM 156B is greater than the height $H_4$ of the first UBM 156A, with the height $H_4$ of the first UBM 156A being within about 3 µm or about 6 µm of the height $H_5$ of the second UBM 156B. In the embodiment illustrated in FIG. 11A, the top surface of the second UBM 156B may be level with or above the upper extent of the top surface of the first UBM 156A and above the lower extent of the top surface of the first UBM 156A. Providing the first UBM 156A and the second UBM 156B with heights within the prescribed ranges helps to ensure that upper extents of subsequently deposited conductive connectors (such as the conductive connectors 160, discussed below with respect to FIG. 13) are within a desired range of one another, which helps to improve coplanarity of the conductive connectors; reduces the risk of cold joints, solder bridges, and the like; and reduces device defects and yield losses.

In the embodiment illustrated in FIG. 11B, the first UBM 156A has the width $W_5$ over the protection layer 142 ranging from about 10 µm to about 90 µm, the width $W_1$ level with a top surface of the protection layer 142 ranging from about 5 µm to about 80 µm or from about 10 µm to about 50 µm, and a bottom surface of the first UBM 156A has the width $W_2$ ranging from about 5 µm to about 80 µm or from about 10 µm to about 50 µm. The first UBM 156A has a height H6 over the protection layer 142 ranging from about 5 µm to about 18 µm. The top surface of the first UBM 156A is concave such that a distance $D_2$ between an upper extent of the first UBM 156A and a lower extent of the top surface of the first UBM 156A ranges from about 0.1 µm to about 10 µm or from about 0.5 µm to about 6 µm. The second UBM 156B has the width $W_6$ over the protection layer 142 ranging from about 5 µm to about 80 µm, the width $W_3$ level with a top surface of the protection layer 142 ranging from about 5 µm to about 80 µm or from about 10 µm to about 50 µm, and a bottom surface of the second UBM 156B has the width $W_4$ ranging from about 5 µm to about 80 µm or from about 10 µm to about 50 µm. The second UBM 156B has a height $H_7$ over the protection layer 142 ranging from about 5 µm to about 18 µm. The top surface of the second UBM 156B may be convex. The top surface of the second UBM 156B is convex such that a distance $D_4$ between an upper extent of the second UBM 156B and a lower extent of the top surface of the second UBM 156B is less than about 0.1 µm. The height $H_7$ of the second UBM 156B may be greater than the height $H_6$ of the first UBM 156A. In some embodiments, the top surface of the second UBM 156B may extend above the top surface of the first UBM 156A a distance $D_3$ ranging from about 0.01 µm to about 3 µm. In the embodiment illustrated in FIG. 11B, the upper extent of the top surface of the second UBM 156B may be above the upper extent of the top surface of the first UBM 156A, the lower extent of the top surface of the second UBM 156B may be level with or above the upper extent of the top surface of the first UBM 156A, and the lower extent of the top surface of the second UBM 156B may be above the lower extent of the top surface of the first UBM 156A. Although the first UBM 156A is illustrated as having angular surfaces and transitions between surfaces, the top surface of the first UBM 156A may have a rounded profile in the cross-sectional view of FIGS. 11A and 11B.

Conductive materials (e.g., a solder material) may be subsequently deposited over the UBMs 156 and reflowed to form conductive connectors. Because of the greater width of the first UBM 156A with respect to the second UBM 156B, reflowing the conductive materials to form the conductive connectors may result in the conductive connector formed over the first UBM 156A having a tendency to have a greater height than the conductive connector formed over the second UBM 156B. However, by forming the first UBM 156A with a concave top surface and the second UBM 156B with a flat or a convex top surface, this height difference is corrected for and the conductive connectors may be subsequently formed with top surfaces having upper extents at the same level or closer to the same level. Specifically, the more concave profile of the first UBM 156A provides a greater volume for the conductive connector formed over the first UBM 156A to fill relative to the conductive connector formed over the second UBM 156B, which lowers the top surface of the conductive connector formed over the first UBM 156A relative to the conductive connector formed over the second UBM 156B. This results in the top surfaces of the conductive connectors being closer to coplanar, reduces yield losses due to cold joints and solder bridges, and reduces device defects. Moreover, because the first UBM 156A and the second UBM 156B are formed simultaneously, less masks are required compared to other methods for improve the coplanarity of the conductive connectors, which reduces production time and costs.

Figure 12:
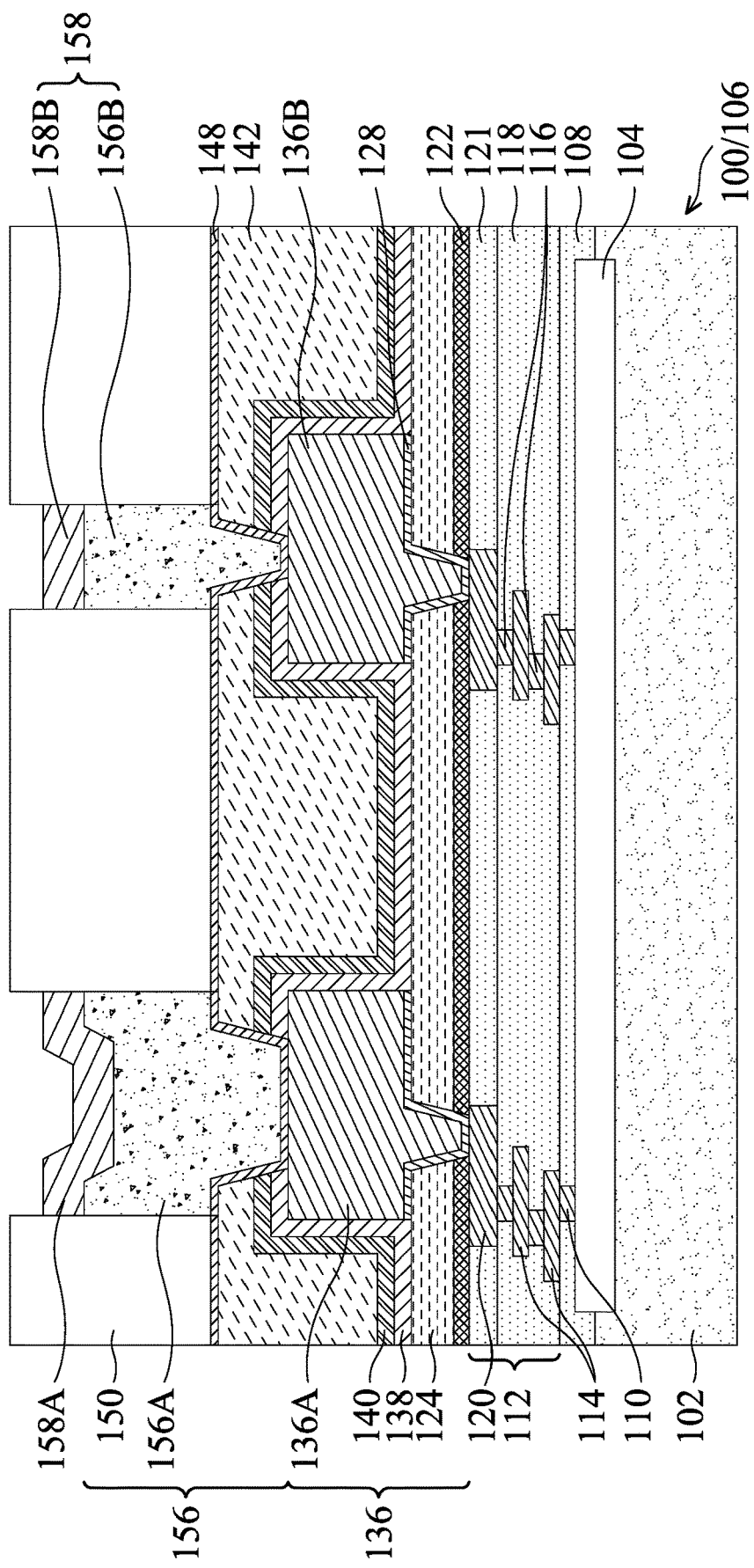

In FIG. 12, a first conductive material 158A and a second conductive material 158B (collectively referred to as a conductive material 158) are deposited over the first UBM 156A in the first opening 152A and the second UBM 156B in the second opening 152B, respectively. In some embodiments, the conductive material 158 is formed by evaporation, electroplating, printing, solder transfer, ball placement, or the like. The conductive material 158 may include a conductive material such as solder, copper, aluminum, gold, nickel, silver, palladium, tin, multiple layers or combinations thereof, or the like. The conductive material 158 may be deposited in the first opening 152A and the second opening 152B simultaneously and may be deposited to a thickness ranging from about 3 µm to about 20 µm.

As illustrated in FIG. 12, the conductive material 158 may be deposited conformally, such that a top surface of the first conductive material 158A has a similar profile to the top surface of the first UBM 156A and a top surface of the second conductive material 158B has a similar profile to the top surface of the second UBM 156B. As a result, the first conductive material 158A may have a concave top surface and the second conductive material 158B may have a flat top surface or a convex top surface. Because of the greater width of the first UBM 156A with respect to the second UBM 156B, reflowing the conductive material 158 may result in the first conductive material 158A having a tendency to have a greater height than the second conductive material 158B. However, by forming the first UBM 156A with a concave top surface and the second UBM 156B with a flat or a convex top surface, this height difference is corrected for and the conductive material 158 may be reflowed to form conductive connectors (such as the conductive connectors 160, discussed below with respect to FIG. 13) having upper extents of top surfaces at the same level or closer to the same level. Specifically, the more concave profile of the first UBM 156A provides a greater volume for the first conductive material 158A to fill during the reflow relative to the second conductive material 158B, which lowers the upper extent top surface of the conductive connector formed over the first UBM 156A relative to the conductive connector formed over the second UBM 156B. This results in the upper extents of the top surfaces of the conductive connectors being closer to coplanar, reduces yield losses due to cold joints and solder bridges, and reduces device defects. Moreover, the first conductive material 158A and the second conductive material 158B are formed simultaneously, reducing production time and costs.

Figure 13:
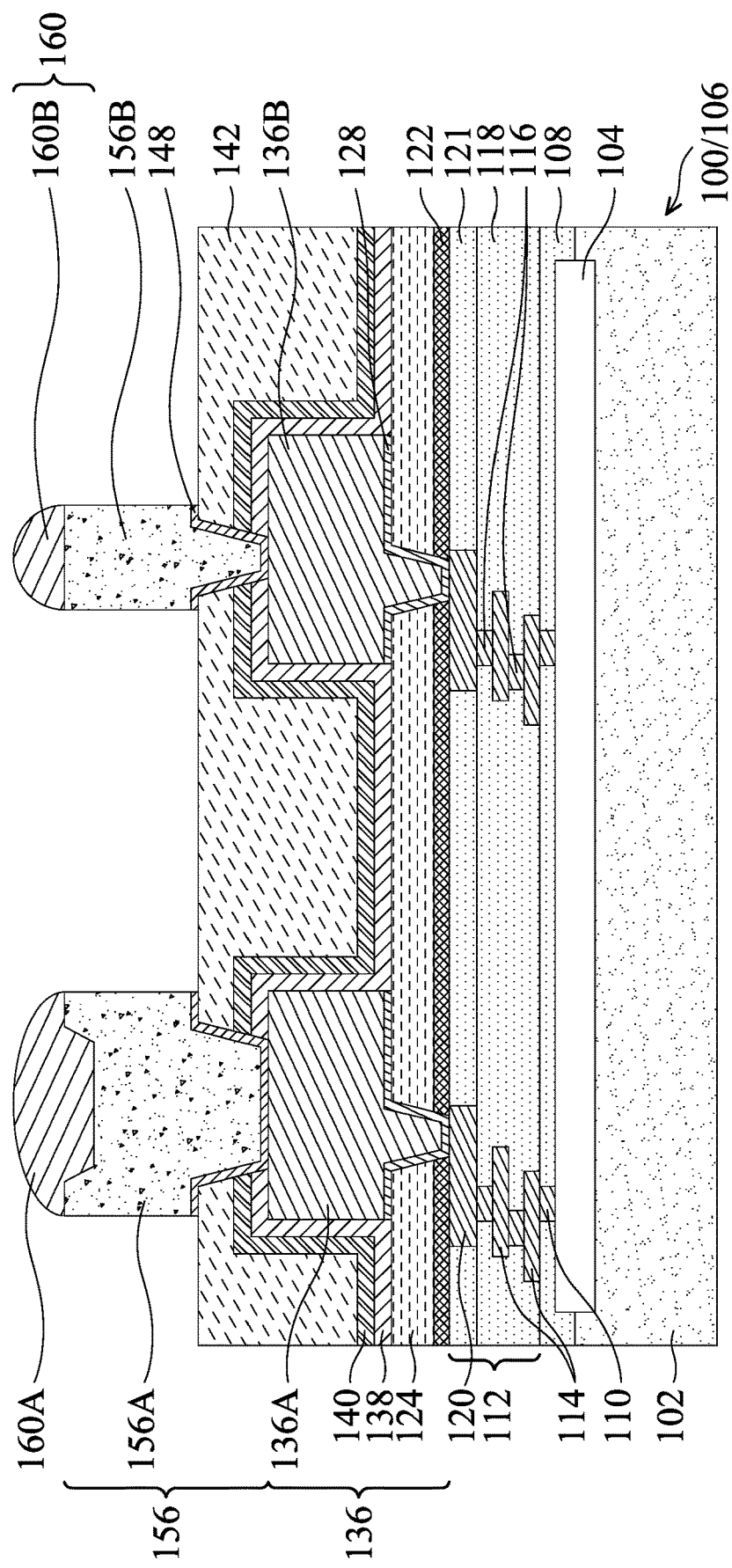

In FIG. 13, the patterned photoresist 150 and portions of the seed layer 148 on which the conductive material 154 is not formed are removed and a reflow is performed on the first conductive material 158A and the second conductive material 158B (illustrated in FIG. 12). The patterned photoresist 150 may be removed by an acceptable ashing or stripping process, such as using an oxygen plasma or the like. Once the patterned photoresist 150 is removed, exposed portions of the seed layer 148 are removed using an acceptable etching process, such as wet or dry etching.

The reflow may be used to shape the first conductive material 158A and the second conductive material 158B into a first conductive connector 160A and a second conductive connector 160B, respectively (collectively referred to as conductive connectors 160). As illustrated in FIG. 13, the conductive connectors 160 may have a spherical shape. The conductive connectors 160 may be ball grid array (BGA) connectors, solder balls, controlled collapse chip connection (C4) bumps, micro bumps, or the like. In some embodiments, first conductive connector 160A may be a C4 bump and the second conductive connector 160B may be a micro bump.

Because of the greater width of the first UBM 156A with respect to the second UBM 156B, reflowing the conductive material 158 may result in the first conductive connector 160A having a tendency to have a greater height than the second conductive connector 160B. However, by forming the first UBM 156A with a concave top surface and the second UBM 156B with a flat or a convex top surface, this height difference is corrected for and the conductive material 158 may be reflowed to form the first conductive connector 160A and the second conductive connector 160B having top surfaces with upper extents at the same level or close to the same level. Although the upper extents of the top surfaces of the first conductive connector 160A and the second conductive connector 160B are illustrated as being level in FIG. 13, a difference in levels of the upper extents of the top surfaces of the first conductive connector 160A and the second conductive connector 160B may range from the first conductive connector 160A being disposed above the second conductive connector 160B by about 3 µm to the second conductive connector 160B being disposed above the first conductive connector 160A by about 3 µm or from the first conductive connector 160A being disposed above the second conductive connector 160B by about 8 µm to the second conductive connector 160B being disposed above the first conductive connector 160A by about 5 µm. Maintaining the upper extents of the top surfaces of the first conductive connector 160A and the second conductive connector 160B within this range of one another may sufficiently improve the coplanarity of the first conductive connector 160A and the second conductive connector 160B, which reduces solder bridging, cold joints, and the like. This reduces device defects, reduces device yield loss, and improves device performance. Moreover, the first conductive material 158A and the second conductive material 158B are formed simultaneously, reducing production time and costs.

Figure 14:
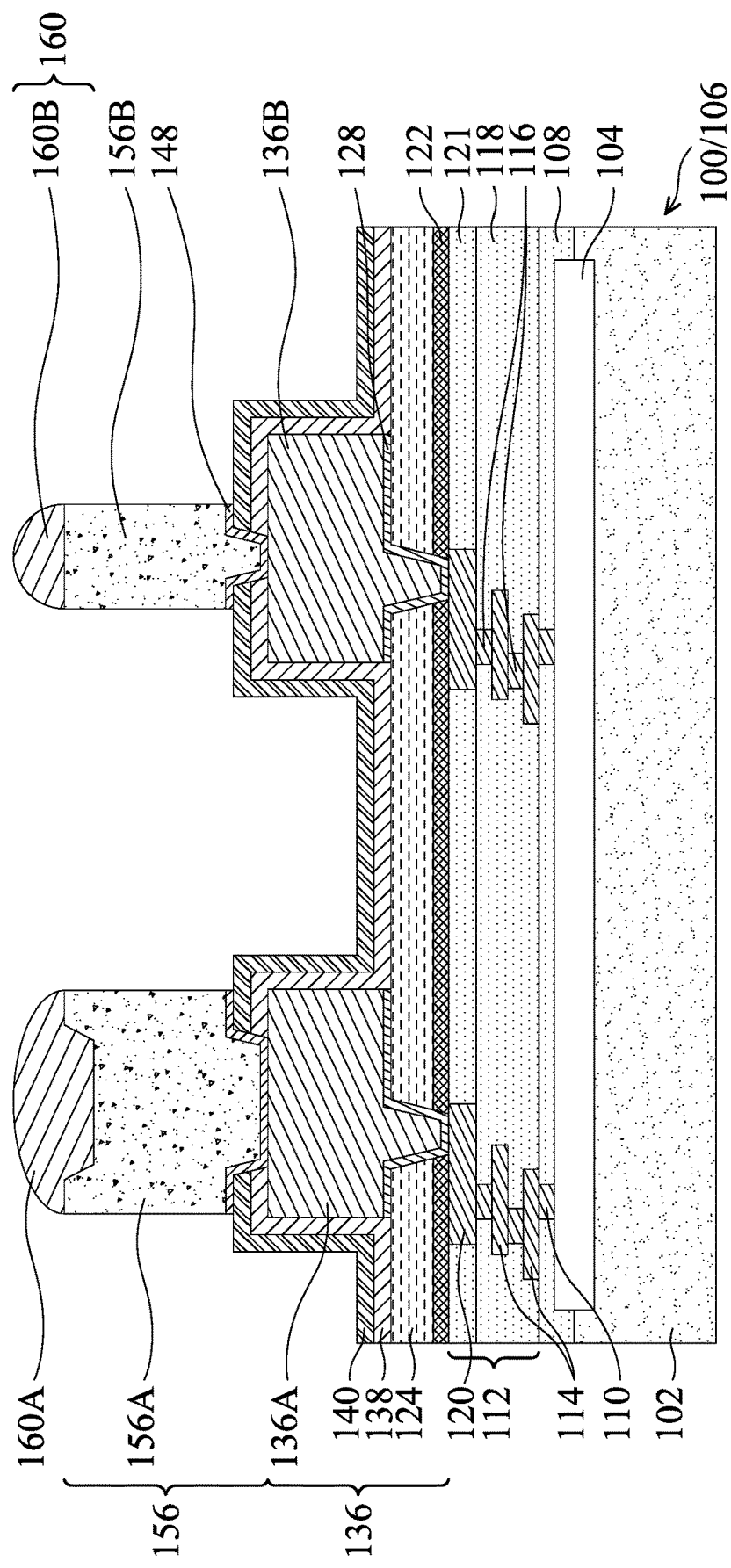

FIG. 14 illustrates an embodiment in which the protection layer 142 is omitted. As illustrated in FIG. 14, the seed layer 148 of the UBMs 156 may be formed directly on a top surface of the fourth passivation layer 140. The UBMs 156 may include horizontal portions extending along the top surface of the fourth passivation layer 140. The steps for forming the UBMs 156 and the conductive connectors 160 may be the same as those discussed above, with only the steps of depositing and patterning the protection layer 142 being omitted. Omitting the protection layer 142 may provide better contact resistance between the UBMs 156 and the underlying RDLs 136, and reduces costs associated with forming the protection layer 142.

Figure 15:
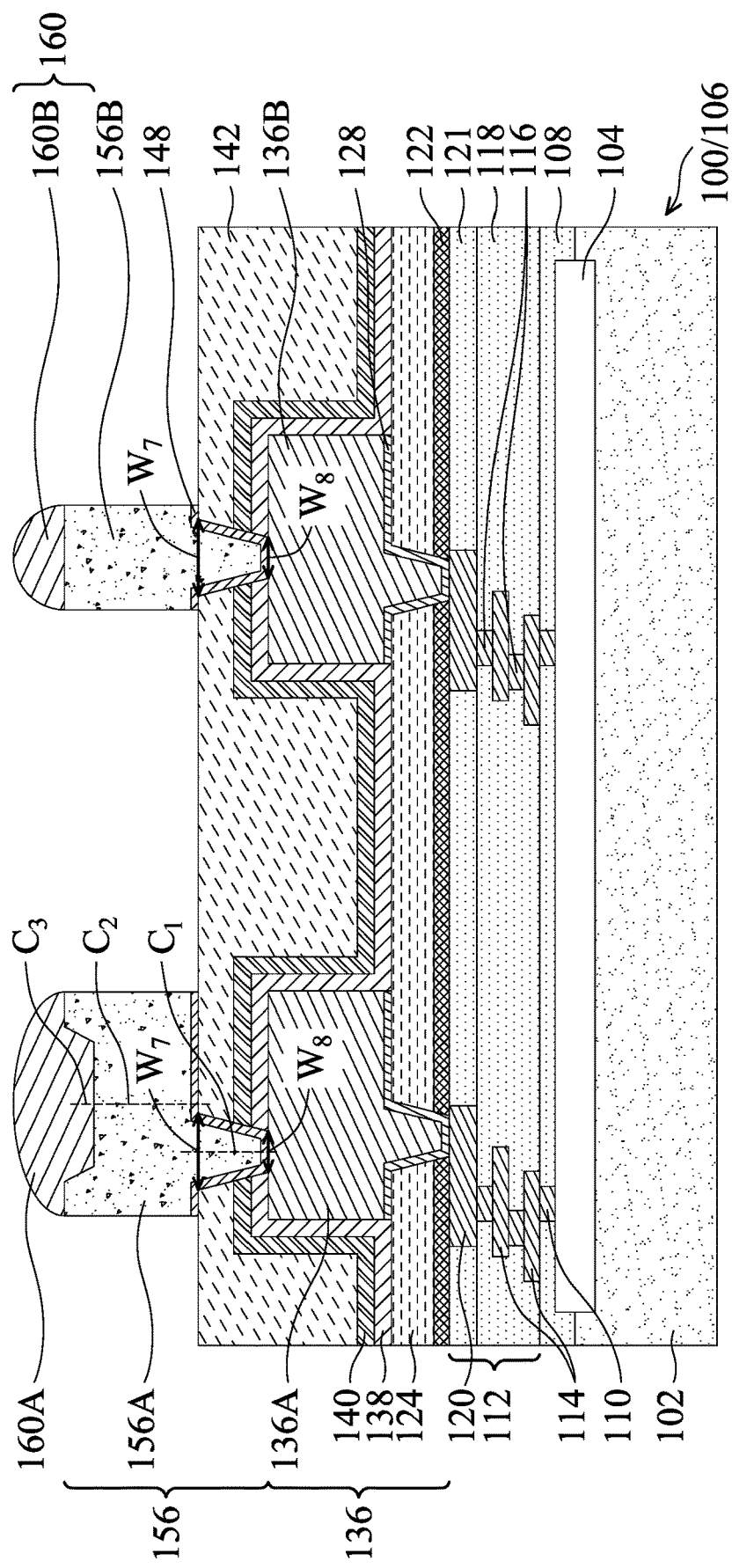

FIG. 15 illustrates an embodiment in which via portions of the UBMs 156 have the same widths. The UBMs 156 illustrated in FIG. 15 may be formed by forming the first opening 144 and the second opening 146 illustrated in FIG. 8 with the same widths, then proceeding with the steps illustrated in FIGS. 9 through 13. As illustrated in FIG. 15, the via portions of the UBMs 156 may have widths $W_7$ level with a top surface of the protection layer 142 ranging from about 5 µm to about 80 µm or from about 10 µm to about 50 µm and widths $W_8$ level with a bottom surface of the third passivation layer 138 over the RDL 136A ranging from about 5 µm to about 80 µm or from about 10 µm to about 50 µm.

As discussed previously, the shape and profile of a concave portion of the first UBM 156A is caused by the width $W_5$ of the first opening 152A (illustrated in FIG. 10), the concentration of the leveling agent present when forming the first UBM 156A, and the current applied when forming the first UBM 156A. As such, the shape and profile of the concave portion of the first UBM 156A may be controlled independent from the shape and profile of the via portion of the first UBM 156A. As illustrated in FIG. 15, a centerline of a via portion $C_1$ of the first UBM 156A may be offset or misaligned from a centerline of a bump portion $C_2$ of the first UBM 156A. A centerline of a concave portion $C_3$ of the first UBM 156A may be aligned with the centerline of the bump portion $C_2$ of the first UBM 156A and offset or misaligned with the centerline of the via portion $C_1$ of the first UBM 156A. Further, in the embodiment illustrated in FIG. 15, the concave portion of the first UBM 156A may have a width that is greater than a width of the via portion of the first UBM 156A. Forming the first UBM 156A according to the above-described embodiments allows for the shape and profile of the concave portion of the first UBM 156A to be set independently of the shape and profile of the underlying via portion of the first UBM 156A, which provides for greater flexibility in forming the first UBM 156A.

Embodiments may achieve various advantages. For example, forming different UBMs having different widths with different surface profiles improves the coplanarity of conductive connectors subsequently formed over the UBMs. This helps to prevent solder bridges, cold joints, and the like, increases throughput, and reduces device defects. Moreover, the UBMs as well as the conductive connectors may be formed simultaneously, which reduces production time and costs.

In accordance with an embodiment, a semiconductor device includes a first redistribution line and a second redistribution line over a semiconductor substrate; a first passivation layer over the first redistribution line and the second redistribution line; a first under-bump metallurgy (UBM) structure over and electrically coupled to the first redistribution line, the first UBM structure extending through the first passivation layer, a top surface of the first UBM structure being concave; and a second UBM structure over and electrically coupled to the second redistribution line, the second UBM structure extending through the first passivation layer, a top surface of the second UBM structure being flat or convex. In an embodiment, the first UBM structure has a first width greater than a second width of the second UBM structure. In an embodiment, the first UBM structure includes a via portion extending through the first passivation layer, and a centerline of the via portion is misaligned with a centerline of a concave portion of the top surface of the first UBM structure. In an embodiment, the first UBM structure includes a via portion extending through the first passivation layer, and a width of the via portion is less than a width of a concave portion of the top surface of the first UBM structure. In an embodiment, the semiconductor device further includes a polymer layer over the first passivation layer, the first UBM structure and the second UBM structure extending through the polymer layer, the first UBM structure having a first height over the polymer layer, the second UBM structure having a second height over the polymer layer, and a difference between the first height and the second height being less than 3 µm. In an embodiment, the semiconductor device further includes a first conductive connector over the first UBM structure, an upper extent of a top surface of the first UBM structure being disposed a first distance over a top surface of the first passivation layer; and a second conductive connector over the second UBM structure, an upper extent of a top surface of the second UBM structure being disposed a second distance over the top surface of the first passivation layer, and a difference between the first distance and the second distance being less than 4 µm. In an embodiment, an upper extent of the top surface of the first UBM structure is level with an upper extent of the top surface of the second UBM structure.

In accordance with another embodiment, a semiconductor device includes a first redistribution line and a second redistribution line over a semiconductor substrate; a first under-bump metallurgy (UBM) structure over and electrically coupled to the first redistribution line, a top surface of the first UBM structure being concave, and the first UBM structure having a first width; and a second UBM structure over and electrically coupled to the second redistribution line, a bottom surface of the second UBM structure being level with a bottom surface of the first UBM structure, the second UBM structure having a second width less than the first width, and a top surface of the second UBM structure being less concave than the top surface of the first UBM structure. In an embodiment, the top surface of the second UBM structure is flat. In an embodiment, the top surface of the second UBM structure is convex. In an embodiment, the semiconductor device further includes a first passivation layer over the first redistribution line and the second redistribution line, the first UBM structure and the second UBM structure extending through the first passivation layer, the first UBM structure and the second UBM structure including horizontal portions extending along a top surface of the first passivation layer. In an embodiment, the semiconductor device further includes a first passivation layer over the first redistribution line and the second redistribution line; and a polymer layer over the first passivation layer, the first UBM structure and the second UBM structure extending through the polymer layer and the first passivation layer, and the first UBM structure and the second UBM structure including horizontal portions extending along a top surface of the polymer layer. In an embodiment, an upper extent of the top surface of the first UBM structure is level with an upper extent of the top surface of the second UBM structure.

In accordance with yet another embodiment, a method includes forming a first conductive feature and a second conductive feature over a semiconductor substrate; depositing a passivation structure over the first conductive feature and the second conductive feature; forming a patterned photoresist over the passivation structure, the patterned photoresist including a first opening over the first conductive feature and a second opening over the second conductive feature; and simultaneously electroplating a first under-bump metallurgy (UBM) structure in the first opening and a second UBM structure in the second opening, the first UBM structure being electrically coupled to the first conductive feature, the second UBM structure being electrically coupled to the second conductive feature, and a surface profile of the first UBM structure being different from a surface profile of the second UBM structure. In an embodiment, the first UBM structure is electroplated with a concave surface profile, and the second UBM structure is electroplated with a flat or convex surface profile. In an embodiment, the first opening has a first area greater than a second area of the second opening in a top-down view. In an embodiment, electroplating the first UBM structure and the second UBM structure includes applying a current with a density from 1 ASD to 15 ASD. In an embodiment, electroplating the first UBM structure and the second UBM structure includes applying an electroplating solution in the first opening and the second opening, the electroplating solution including a leveling agent, a greater concentration of the leveling agent being adsorbed on a surface of the first UBM structure than a surface of the second UBM structure. In an embodiment, the method further includes simultaneously depositing a conductive material over the first UBM structure and the second UBM structure; and reflowing the conductive material to form a first conductive connector over the first UBM structure and a second conductive connector over the second UBM structure. In an embodiment, electroplating the first UBM structure and the second UBM structure includes applying an electroplating solution in the first opening and the second opening, the electroplating solution including a leveling agent, the leveling agent including chlorine, the leveling agent having a concentration in the electroplating solution ranging from 5 cc/L to 30 cc/L.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first conductive feature and a second conductive feature over a semiconductor substrate;
depositing a passivation structure over the first conductive feature and the second conductive feature;
forming a patterned photoresist over the passivation structure, the patterned photoresist comprising a first opening over the first conductive feature and a second opening over the second conductive feature; and
simultaneously electroplating a first under-bump metallurgy (UBM) structure in the first opening and a second UBM structure in the second opening, wherein the first UBM structure is electrically coupled to the first conductive feature, wherein the second UBM structure is electrically coupled to the second conductive feature, and wherein the first UBM structure is electroplated with a concave surface profile, and wherein the second UBM structure is electroplated with a flat or convex surface profile.

2. The method of claim 1, wherein the first opening has a first area greater than a second area of the second opening in a top-down view.

3. The method of claim 2, wherein electroplating the first UBM structure and the second UBM structure comprises applying a current with a density from 1 ASD to 15 ASD.

4. The method of claim 1, wherein electroplating the first UBM structure and the second UBM structure comprises applying an electroplating solution in the first opening and the second opening, the electroplating solution comprising a leveling agent, wherein a greater concentration of the leveling agent is adsorbed on a surface of the first UBM structure than a surface of the second UBM structure.

5. The method of claim 1, further comprising:
simultaneously depositing a conductive material over the first UBM structure and the second UBM structure; and
reflowing the conductive material to form a first conductive connector over the first UBM structure and a second conductive connector over the second UBM structure.

6. The method of claim 1, wherein electroplating the first UBM structure and the second UBM structure comprises applying an electroplating solution in the first opening and the second opening, the electroplating solution comprising a leveling agent, the leveling agent comprising chlorine, the leveling agent having a concentration in the electroplating solution ranging from 5 cc/L to 30 cc/L.

7. The method of claim 1, wherein the second UBM structure has a convex surface profile.

8. A method of forming a semiconductor device, the method comprising:
forming a first conductive feature and a second conductive feature over a semiconductor substrate;
depositing a passivation structure over the first conductive feature and the second conductive feature;
forming a patterned photoresist over the passivation structure, the patterned photoresist comprising a first opening and a second opening, the first opening exposing the first conductive feature, the second opening exposing the second conductive feature, a first width of the first opening being greater than a second width of the second opening; and
simultaneously electroplating a first under-bump metallurgy (UBM) structure in the first opening and a second UBM structure in the second opening using an electroplating solution, the electroplating solution comprising a leveling agent, wherein after electroplating the first UBM structure has a concave surface greater than a surface of the second UBM structure.

9. The method of claim 8, wherein a greater concentration of the leveling agent is present in the first opening than the second opening during the electroplating.

10. The method of claim 8, wherein the leveling agent comprises chlorine, the leveling agent having a concentration in the electroplating solution ranging from 5 cc/L to 30 cc/L.

11. The method of claim 10, wherein the electroplating is performed using a current density ranging from about 1 ASD to about 15 ASD.

12. The method of claim 8, wherein a surface of the second UBM structure is convex.

13. The method of claim 12, wherein a difference in a height of the first UBM structure and a height of the second UBM structure is in a range of 0.01 µm to about 3 µm.

14. The method of claim 8, wherein the concave surface has a depth in a range of 0.5 µm to about 6 µm.

15. A method of forming a semiconductor device, the method comprising:
forming a first redistribution line and a second redistribution line over a semiconductor substrate;
forming a first under-bump metallurgy (UBM) structure over and electrically coupled to the first redistribution line, wherein a top surface of the first UBM structure is concave, wherein the first UBM structure has a first width; and
forming a second UBM structure over and electrically coupled to the second redistribution line, wherein a bottom surface of the second UBM structure is level with a bottom surface of the first UBM structure, wherein the second UBM structure has a second width less than the first width, and wherein a top surface of the second UBM structure is less concave than the top surface of the first UBM structure.

16. The method of claim 15, wherein the top surface of the second UBM structure is flat.

17. The method of claim 15, wherein the top surface of the second UBM structure is convex.

18. The method of claim 15, further comprising:
forming a first passivation layer over the first redistribution line and the second redistribution line, the first UBM structure and the second UBM structure extending through the first passivation layer, wherein the first UBM structure and the second UBM structure extend over a top surface of the first passivation layer.

19. The method of claim 18, further comprising:
forming a polymer protection layer over the first passivation layer, wherein the first UBM structure and the second UBM structure extend through the polymer protection layer and the first passivation layer, wherein the first UBM structure and the second UBM structure extend over a top surface of the polymer protection layer, wherein an upper surface of the polymer protection layer is flat.

20. The method of claim 15, wherein forming the first UBM structure and forming the second UBM structure are performed simultaneously using a plating solution, wherein the plating solution comprises copper sulfate having a concentration ranging from about 20 g/L to about 175 g/L, sulfuric acid having a concentration ranging from about 50 g/L to about 300 g/L, hydrochloric acid having a concentration ranging from about 10 ppm to about 100 ppm, a leveling agent having a concentration ranging from about 5 cc/L to about 30 cc/L, an accelerator agent having a concentration ranging from about 5 cc/L to about 30 cc/L, and a suppressor agent having a concentration ranging from about 5 cc/L to about 30 cc/L.

* * * * *